United States Patent [19]
Park et al.

[11] Patent Number: 5,360,753
[45] Date of Patent: Nov. 1, 1994

[54] MANUFACTURING METHOD FOR A SEMICONDUCTOR ISOLATION REGION

[75] Inventors: Tai-seo Park, Seoul; Yun-gi Kim, Wonjoo; Dong-chul Park, Seoul; Sung-tae Ahn, Kwancheon; Byeong-yeol Kim, Suwon, all of Rep. of Korea

[73] Assignee: Samsung Electronics Co., Ltd., Kyungki-do, Rep. of Korea

[21] Appl. No.: 127,155

[22] Filed: Sep. 27, 1993

[30] Foreign Application Priority Data

Sep. 25, 1992 [KR] Rep. of Korea .................... 92-17555

[51] Int. Cl.$^5$ ............................................ H01L 21/76
[52] U.S. Cl. ......................................... 437/67; 437/72; 437/69
[58] Field of Search ............................ 437/67, 69, 72; 148/DIG. 50, DIG. 85, DIG. 86

[56] References Cited

U.S. PATENT DOCUMENTS 5,004,703  2/1991  Zdeble et al. ........................ 437/67
5,096,848  3/1992  Kawamura ............................ 437/67

FOREIGN PATENT DOCUMENTS 60-241231  11/1985  Japan .................................... 437/67

*Primary Examiner*—George Fourson
*Assistant Examiner*—Savitri Mulpuri
*Attorney, Agent, or Firm*—Cushman, Darby & Cushman

[57] ABSTRACT

In an element isolation method of a semiconductor device which can form an element isolation region having a flat surface without regard to the width of the element isolation region, and whose width is below the resolution limit, an insulating film having an aperture in order to define the element isolation region is formed on the semiconductor wafer, wherein an oxidizable material layer is deposited and then first spacers are formed on the sidewalls of the aperture. Then, a thermal oxide film is formed over the entire semiconductor wafer, excluding a first-spacer-formed region, and the first spacer is removed. The wafer surface is exposed to the lower part of the removed first spacer region, and then the portion of the semiconductor wafer below the exposed region is etched to thereby form a trench. After that, an element isolation region is formed by filling up the trench and removing the insulating film around tile trench. Additionally, a second spacer is formed on the sidewalls of the first spacer so as to further reduce the element isolation region. Accordingly, a highly integrated semiconductor device can be accomplished by forming an element isolation region whose size is below the resolution limit and whereby good element isolation characteristics are provided.

19 Claims, 12 Drawing Sheets

MANUFACTURING METHOD FOR A SEMICONDUCTOR ISOLATION REGION

BACKGROUND OF THE INVENTION

The present invention relates to a manufacturing method for a semiconductor device, and more particularly, to a method for isolating elements of a semiconductor device by means of trenches and the local oxidation of silicon (LOCOS), so as to be usefully applied to highly integrated memory devices and to improve the electrical characteristics of the elements.

The electrical isolation of each element formed on a silicon wafer is needed in the large-scale integration of chips. Recently, techniques for reducing the width of an isolation area and the size of each element formed on a semiconductor wafer have been developed as semiconductor devices become more integrated. The development of techniques to isolate semiconductor elements on a wafer from one another is becoming very important in competition among semiconductor manufacturers.

A junction isolation method for isolating bipolar-type elements was developed in the early days of the semiconductor industry, when bipolar-type integrated circuits first entered main stream use. Although the junction isolation method is very simple, the element isolation area is relatively large. Thus, this method is actually an obstacle in increasing integration, and lowers the circuit's operating speed due to a resulting high parasitic capacitance.

Additionally, a MOS transistor has been developed with a structure entirely different from that of a bipolar-type transistor. Accordingly, an element isolation structure different from the above junction isolation method is required. Under these circumstances, a LOCOS method is utilized which forms a semi-recessed oxide in a non-active region (field region) of a substrate.

The above-noted LOCOS method is widely used due its many merits, which include a reduced junction capacity, reduced parasitic effects, ease of self alignment processing and reduced spreading in the transverse direction in comparison with the conventional junction isolation method. However, the conventional LOCOS method also has drawbacks: (a) a great deal of field oxide permeates the element active region to thereby form an undesirable bird's beak structure, (b) the application of sub micron lithography techniques is difficult due to flexion of the surface, and (c) due to the long-term oxidation, the re-distribution of impurities results in certain unwanted defects. To overcome these drawbacks of the LOCOS method, many modified LOCOS methods have been proposed. Some examples of these modified LOCOS methods are: (1) a method of forming a field oxide by oxidizing the recessed part of a substrate, (2) an etched-back LOCOS method that etches back a part of the field oxide so as to reduce the bird's beak and gain a more planarized surface after the field oxide is grown, (3) a method of using a poly-buffer pad film (poly 50 nm/oxide film 5–10 nm) and a nitride film (100–240 nm) instead of using a common pad oxide film, (4) a sealed interface local oxidation (SILO) method that forms a silicon nitride film directly on a silicon substrate prior to the formation of the pad oxide film, and (5) a sidewall-masked isolation (SWAMI) technique that uses a sidewall mask. However, even though various modified LOCOS methods may be used, there is a limit to reducing the isolation region, due to the presence of the bird's beak. Also, the partial oxidation processing stresses the semiconductor wafer which degrades junction characteristics and thereby diminishes a DRAM's refresh characteristic.

Besides the above modified LOCOS methods, methods of isolating the element without partially oxidizing the semiconductor substrate have also been proposed. Examples of such include a trench isolation method and a selective epitaxial isolation method.

The trench isolation method calls for forming a trench in the semiconductor wafer and then filling the trench with polysilicon or insulating material so as to isolate an element. This method can reduce both parasitic capacitance and the isolation region of the element.

However, since the ultimate surface shape of the filling material varies depending on the trench size, the general trench isolation method results in poor step coverage by a subsequent film stacked on the filling material. Specifically, when a MOS element is formed in an active region such that a gate electrode of the MOS element extends so as to traverse the trench, a signal can be delayed due to the poor step coverage of the trench. In addition, a narrow trench is filled excessively in order to sufficiently fill the wide trench, which causes difficulty in planarization. Generally, since the width of the element isolation region formed in a semiconductor wafer is irregular, the trench element isolation technique is unsuitable as a replacement for the conventional LOCOS method when trenches of differing widths are to be formed.

To overcome the above drawbacks of the trench isolation method, a double trench isolation (DTI) method has been proposed, which forms a trench having a certain width and depth around the isolation region, and then fills the trench with an insulating material to form an element isolation region. For example, Korean Patent laid open publication No. 92-702022 (PCT Application No. PCT/JP 90/01321 by Masshita Ikuya) discloses an isolation method, accomplished by forming a groove between the element active region and the element isolation region of the semiconductor wafer, in order to provide an element isolation technique by means of a trench which permits a good element isolation characteristic and a planarized surface of the element isolation region, without regard to the width of the element isolation region.

FIG. 1 to FIG. 6 are schematic representations showing the conventional method in the above Korean Patent laid open publication.

FIG. 1 shows a step of forming a multi-layer pattern to define an active region on the semiconductor wafer. More specifically, a tri-layer which comprises a first silicon nitride film 102, a first silicon oxide film 103 and a second silicon nitride film 104 is formed on a semiconductor wafer 101, and a photoresist pattern 105 is formed in the element formation region of semiconductor wafer 101. Then, etching the tri-layer using photoresist pattern 105 forms a tri-layer pattern.

FIG. 2 shows a step of forming a spacer on the sidewalls of the tri-layer pattern, and forming grooves in portions which will be isolation regions of the semiconductor wafer using the spacer. That is, photoresist pattern 105 is removed and a third silicon nitride film is deposited on the wafer, on which the pattern of the above tri-layer is formed, which then is anisotropically etched so as to form a third silicon nitride spacer 106. Then, the exposed portions semiconductor wafer 101 is anisotropically etched and first grooves 107 are formed, using second silicon nitride film 104 and a third silicon nitride film spacer 106 as etching masks.

FIG. 3 shows a step of filling first grooves 107 with a second silicon oxide film 108, and depositing a photoresist so as to form a photo- resist pattern 109 in an element isolation region, over which a third silicon oxide film 110 is then formed.

FIG. 4 shows a step of etching back third silicon oxide film 110 and a second silicon oxide film 108. Then, photoresist pattern 109 is removed.

FIG. 5 shows a step of an anisotropically etching of the semiconductor wafer 101 which is exposed by removing second silicon nitride film 104 and third silicon nitride film spacer 106. Here, second grooves 111 are formed by removing third silicon nitride spacer 106 and etching the exposed semiconductor wafer, using first and second silicon oxide films 103 and 108 as masks.

FIG. 6 shows a step of growing a thin oxide film 112 on the whole surface of the resultant structure including second grooves 111, and filling second grooves 111 with a polysilicon 113 by a deposition. Then, an upper part of polysilicon 113 is oxidized and the resultant structure is etched back so as to expose semiconductor wafer 101, as seen in FIG. 6.

According to the above method, since first silicon nitride film 102 is formed directly on semiconductor wafer 101, a pit is generated and the quality of the gate oxide film which is to be formed in subsequent processing is lowered. Additionally, when second grooves 111 are filled with polysilicon 113, a hump is generated in the boundary between the groove and the active region due to a step occurring between them. Therefore, electrical characteristics of the transistor are degraded, and the polysilicon which fills a grooves 111 and the polysilicon of the gate electrode are apt to make direct contact with each other. If they do not contact directly, the thickness of the gate oxide film therebetween is too thin to maintain suitable insulation characteristics.

Meanwhile, commonly owned U.S. Pat. application Ser. No. 07/955,108 now (application Pat. No. 5,308,784, date: 1 Oct. 1, 1992 by Y. K. Kim et al.) having a similar purpose with that of the above-described Ikuya et al. disclosure, combines the aforementioned double trench isolation method with the LOCOS method to form a trench isolation structure between the element active region and element isolation region. Here, a field oxide film is formed in the center of the element isolation region by the LOCOS method. By the above invention of Kim et al. (also the inventors of the present invention), the surface of the element isolation region is planarized without regard to the width of the element isolation region to thus form an element isolation well.

FIGS. 7 to 12 illustrate the element isolation method disclosed in the aforementioned U.S. patent application Ser. No. 07/955,108. Now U.S. Pat. No. 5,308,784

FIG. 7 is a sectional view showing a step of forming a multi-layer pattern which has an a aperture to define an element isolation region on a semiconductor wafer. That is, a pad oxide film 121, a nitride film 122 and a high temperature oxide (HTO) film 123 are sequentially formed on semiconductor wafer 120 to predetermined thicknesses, and then a photoresist layer is deposited. After that, a photoresist pattern 124 is formed to define non-active region for etching the exposed pad oxide film 121, nitride film 122, and HTO film 123. A dry etching like reactive ion etching (RIE) is continued until a portion of semiconductor wafer 120 is exposed. An aperture 125 is thereby formed.

FIG. 8 is a sectional view showing a step in which photoresist pattern 124 is removed and a spacer is formed on the sidewalls of aperture 125. In more detail, photoresist pattern 124 for forming aperture 125 is removed. Thereafter, a silicon nitride film or polysilicon is deposited on the entire surface of the wafer, and then is anisotropically etched so as to form a spacer 126 on the sidewall of aperture 125. At this moment, semiconductor wafer 120 is exposed via the aperture 125, which is further defined by spacer 126.

Then, a thermal oxidation is performed in the wafer region and the silicon in the portion of the semiconductor wafer exposed through aperture 125 is consumed toward the wafer direction, which gradually forms a thermal oxide layer. As a result, a thermal oxide film 127 extends below the wafer's surface and has a width is somewhat wider than the region defined by the spacer 126.

FIG. 9 is a sectional diagram showing a step of forming a trench along the sidewalls of an element isolation region. In more detail, spacer 126 formed on the sidewalls of the aperture 125 is dry-etched and removed. Then, by dry etching, trenches 128, 129 having a predetermined depth and width are formed in the exposed wafer along the boundaries of the non-active region, adjacent thermal oxide film 127.

FIG. 10 is a sectional view showing a step of exposing the wafer by dry-etching and removing the thermal oxide film 127 which functioned as a trench buffer layer after trenches 128, 129 were formed. At this time, a flat wafer surface having a pre-determined depth with respect to the surface of the wafer within the aperture is realized as shown in FIG. 10.

FIG. 11 is a sectional view showing a step of filling the inside of trenches 128, 129 with proper insulating materials. That is, thermal oxidation is performed on the exposed wafer, such that the trenches are filled with a thermal oxide film 130. At this time, the thermal oxide film 130 penetrates only slightly into wafer 120, as shown by the dotted lines in FIG. 11.

FIG. 12 is a sectional view showing a step of completing the element isolation region in wafer 120. That is, when the pad oxide film 121 and a nitride film 122 are removed by wet etching in order to expose the active region, an element isolation region having a certain element isolation width 131 is completed on semiconductor wafer 120.

Since the boundary of an element isolation region is fixed by a trench in the disclosed element isolation method (U.S. application Ser. No. 07/955,108), now U.S. Pat. No. 5,308,784 an element isolation technique without regard to the width of an element isolation region can be applied. Further, the element isolation region has a planarized surface, which avoids signal delay caused by the conventionally poor step coverage in a metal wiring between active regions. In addition, short circuits which have conventionally occurred in wiring due to the poor step coverage do not occur.

However, in the disclosed element isolation method, when a nitride film spacer 126 is removed, it is hard to distinguish nitride spacer 126 from nitride film 122 of aperture pattern, which then causes difficulty in precise etching. Besides a limitation of the resolution of photolithography techniques, a thermal oxide film (reference numeral 130 in FIG. 11) penetrates the active region during the thermal oxidation processing for filling trenches 128 and 129, which establishes a 0.5 μm-wide element isolation region and thereby impedes high integration. Additionally, a great deal of lateral stress is generated in the boundary between the trench and the active region.

SUMMARY OF THE INVENTION

It is an object of the present invention to provide a manufacturing method of a semiconductor device which permits the formation of a planarized surface of an element isolation region regardless of its width.

It is a further object of the present invention to provide an element isolation method of a semiconductor device which can prevent a penetration of the bird's beak into the active region.

It is a still further object of the present invention to provide an element isolation method of a semiconductor device which can form the width of the element isolation region within resolution limits.

According to the present invention, since an oxidizing material layer is formed on the entire surface of a wafer having an aperture prior to the formation of a spacer along the sidewalls of the aperture, side erosion of the thermal oxide film is suppressed by the operation of the oxidizing substance layer as a buffer layer in a thermal oxidation process. Additionally, a first spacer is formed so as to reduce the width of the element isolation region after the active region is defined. After the trench is formed, a thin silicon nitride film is deposited inside the trench before the trench is filled with an oxidizing material, e.g., a polysilicon. Thus, excessive growth of the field oxide film can be restrained, when the polysilicon is processed by the second thermal oxidation in order to form a field oxide film. As a result, an element isolation structure can be formed wherein the width is narrow, i.e., about 0.2 μm, which is below the resolution limit of a photo-lithography process can be formed.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

The present invention will be described below in more detail with reference to the attached drawings.

EMBODIMENT 1

FIGS. 13 through FIG. 18 illustrate a first embodiment of the present invention.

Figure 1:
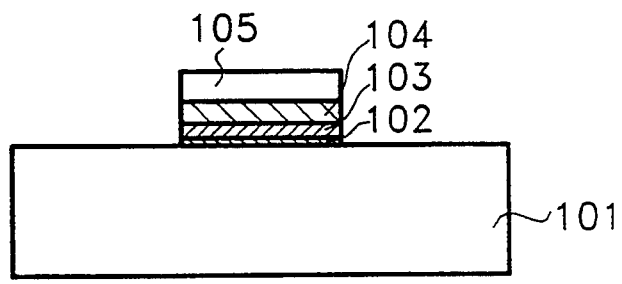
FIGS. 1-6 illustrate an embodiment of an conventional double trench isolation method.
Figure 2:
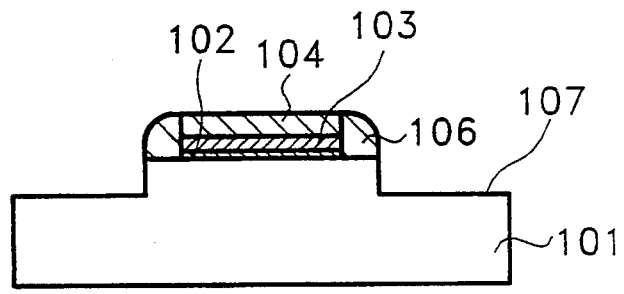
Figure 3:
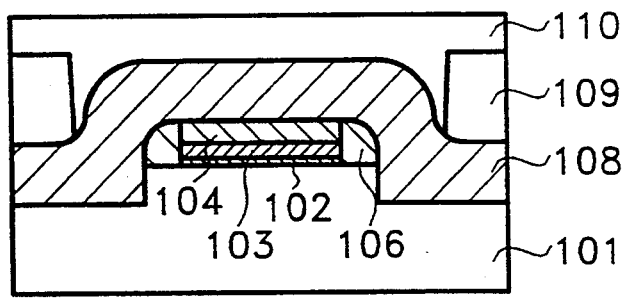
Figure 4:
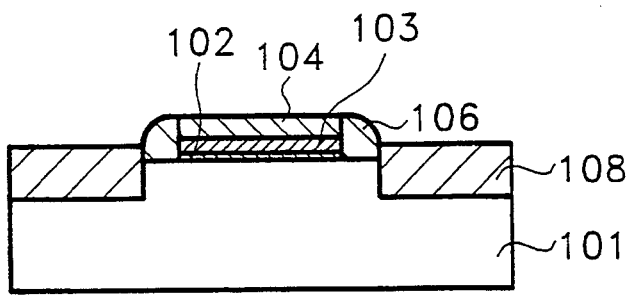
Figure 5:
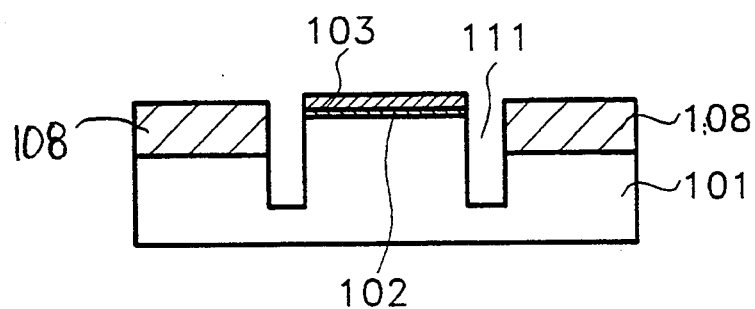
Figure 6:
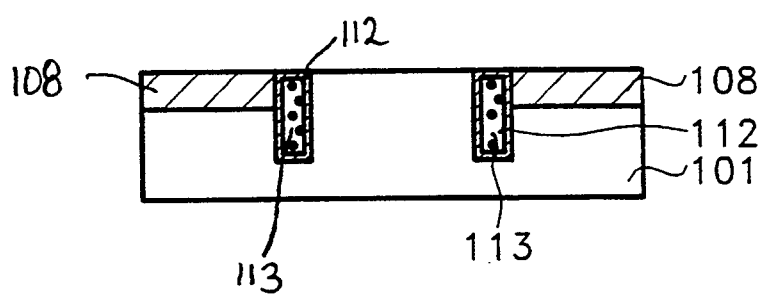
Figure 7:
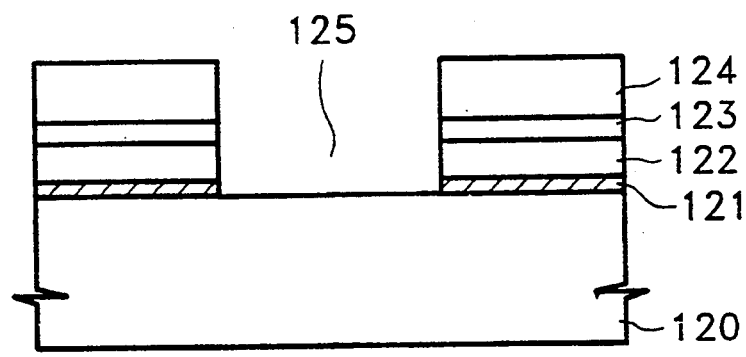
FIGS. 7-12 illustrate an embodiment of the method disclosed in U.S. Pat. Application No. 07/955,108 (a prior application by the same inventors of the present invention)
Figure 8:
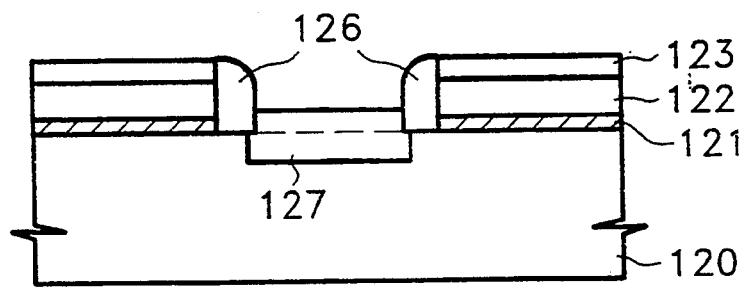
Figure 9:
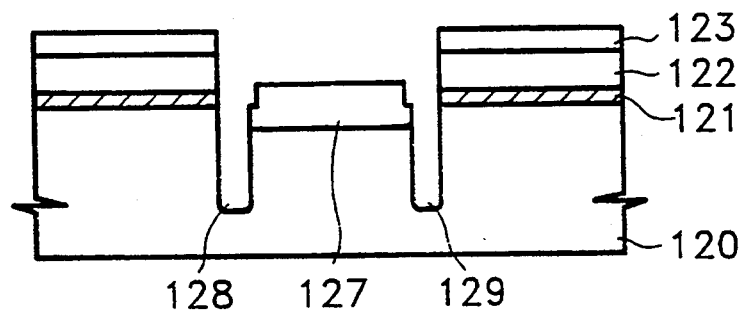
Figure 10:
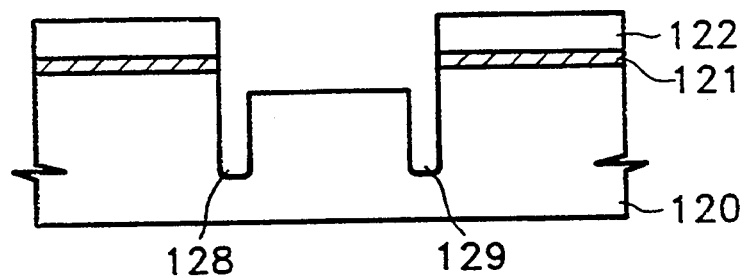
Figure 11:
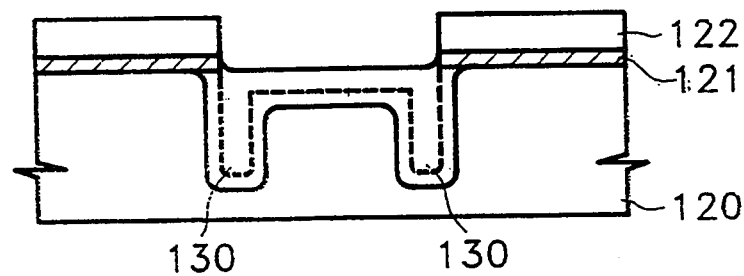
Figure 12:
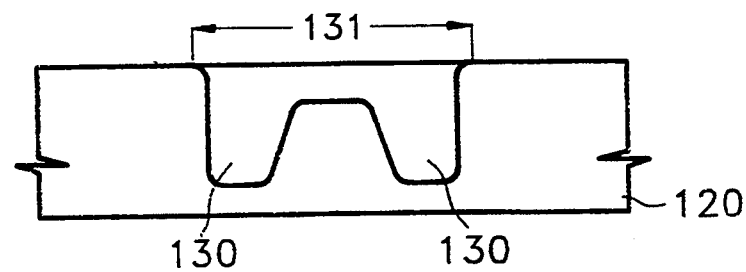
Figure 13:
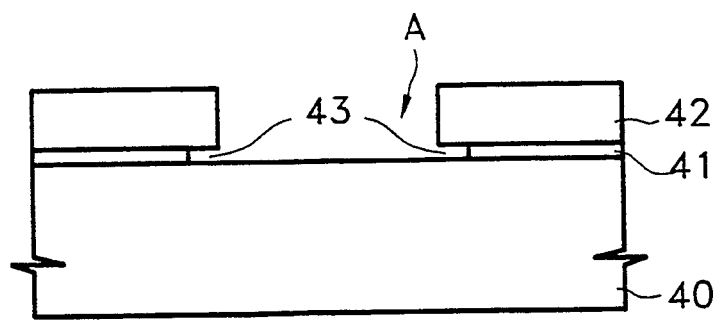
FIGS. 13-18 illustrate a first embodiment of the element isolation method according to the present invention.

FIG. 13 shows a step of forming an aperture A which defines an element isolation region. First, a pad oxide film 41 having a thickness of tens of angstroms to about 300 angstroms and a silicon nitride film 42 having a thickness of about 300 -1500Å are formed on a semiconductor wafer 40. After that, a photoresist layer is deposited and then a photoresist pattern (not shown) is formed on silicon nitride film 42 through a process of mask exposure and development. Thereafter, silicon nitride film 42 and pad oxide film 41 sequentially are dry-etched using the photo- resist pattern as an etching mask to thereby form aperture A exposing an element isolation region of semiconductor wafer 40.

Next, an undercut region 43 is formed along the lower edges of aperture A, as shown in FIG. 13, by etching the lower portion of the aperture. Here, pad oxide film 41 is etched transversely by a few hundreds of angstroms using an etching solution such as a buffered oxide etch ant (BOE).

Figure 14:
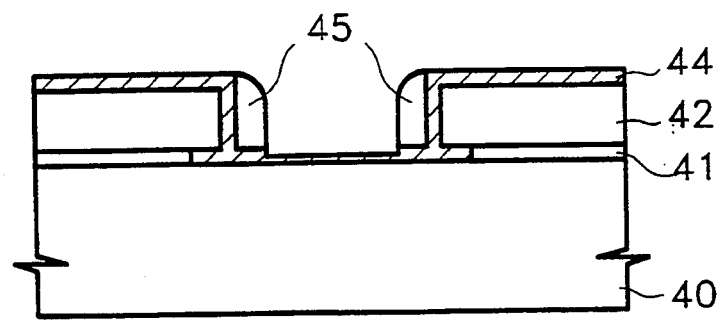

FIG. 14 shows a step of forming a polysilicon is layer 44 and spacers 45. An oxidizing substance such as polysilicon is deposited to a thickness of about 30Å to 300Å on the resultant structure shown in FIG. 13 having undercut region 43 to thereby form a polysilicon layer 44 which fills the undercut region 43. Then, a spacer material such as silicon nitride film or HTO film is deposited on polysilicon layer 44 to a thickness of about 500Å to 1500Å. Then, the silicon nitride film is anisotropically etched to form spacers 45 on the sidewalls of polysilicon layer 44. When etching to form spacers 45, a portion of the polysilicon layer 44 exposed between spacers 45 may also be etched, as illustrated in FIG. 14.

Figure 15:
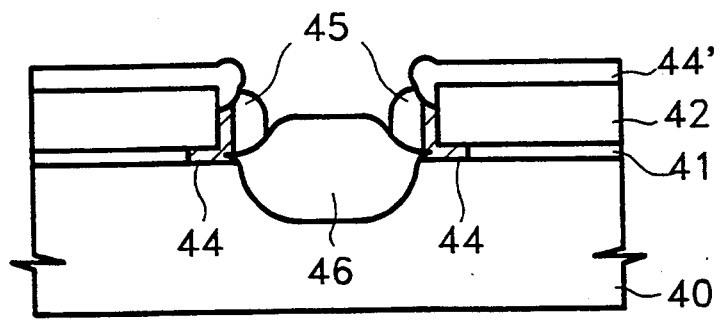

FIG. 15 shows a step of first thermal oxidation. When the entire semiconductor wafer is exposed to a high-temperature wet oxidation atmosphere using spacers 45 as an anti-oxidant mask, the portion of polysilicon layer 44 between spacers 45 is oxidized to form a first oxide film 46 to a thickness of about 500Å to 1000Å. Here, the exposed polysilicon layer 44 is oxidized simultaneously so as to form a second oxide film 44' on silicon nitride film 42.

At this time, the thermal oxidation period must be controlled in order to make the width of the trench between about 300Å to 600Å. If the first thermal oxidation is carried out too long, an undesirable bird's beak is formed which penetrates the active region. This may reduce, or completely remove, the portion where the trench is to be formed.

In the thermal oxidation process, stresses experienced by the semiconductor wafer below the spacer 45 can be eased through the portion of polysilicon 44 making contact with spacer 45. Additionally, polysilicon 44 works as an etching end point in the process for removing the spacer 45 after its formation.

Figure 16:
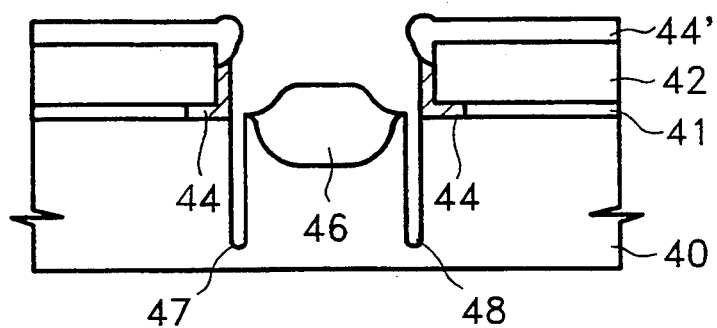

FIG. 16 shows a step of forming a trench. polysilicon 44 is exposed by removing a capping oxide film (not shown) which is formed on the spacer 45 during the thermal oxidation process using BOE, for example, or diluted hydrogen fluoride (HF) as an etching solution, and by wet or dry etching spacer 45. At this time, the exposure of silicon nitride film 42 on the active region should be avoided. Then, trenches 47 and 48 having a depth of about 2,000Å to 8,000Å are formed in semiconductor wafer 40 by performing an etching process after removing the remaining polysilicon 44 using wet-etching, or by doing so without the removal of the remaining polysilicon.

Figure 17:
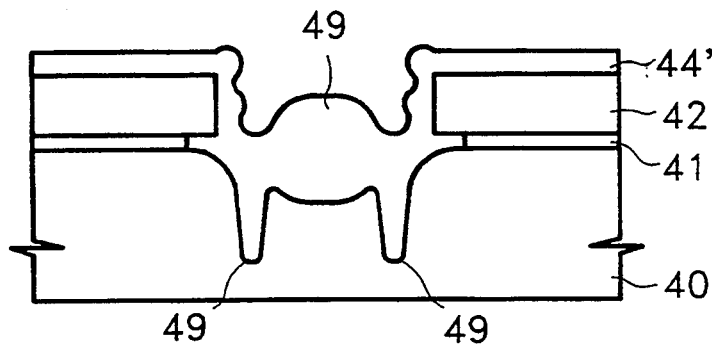

FIG. 17 shows a step of second thermal oxidation. That is, the resultant material of FIG. 16 wherein trenches 47 and 48 are formed is exposed to a high-temperature wet oxidation atmosphere so as to form a thermal oxide film 49 whose thickness is about 300Å to 2,000Å, to thereby fill the trenches 47 and 48 with thermal oxide film 49. At this time, the remaining polysilicon 44 is oxidized and is effectively combined with thermal oxide film 49.

Figure 18:
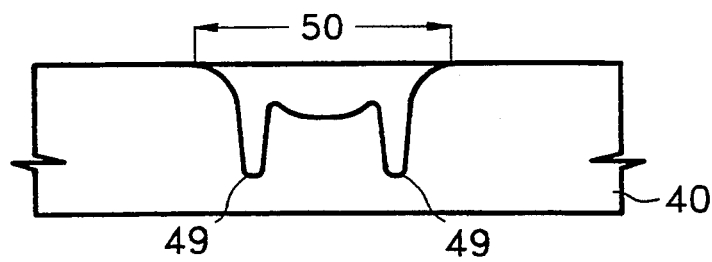

FIG. 18 shows a final shape of an element isolation region according to the present invention. First, oxide film 44' and silicon nitride film 42 formed on the active region are both removed. After that, any impurities left on the wafer from silicon nitride film 42 are removed by a sacrificial oxidization of the wafer. Then, the remaining oxide film is removed to obtain the final shape of the element isolation region with an element isolation width 50 as shown.

According to the first embodiment of the present invention, an undercut region is formed under the lower edges of the silicon nitride film of an aperture pattern which defines an element isolation region. Then, an oxidizing substance layer such as polysilicon is formed so as to fill the undercut region. This oxidizing substance layer acts as a buffer layer while it is oxidized during the first thermal oxidation, to thereby reduce the formation of a bird's beak. As a result, the element isolation region can be further reduced in size. In addition, an etching process can be easily performed since the silicon nitride film 42 of an aperture pattern is free from etching when the nitride spacers 45 are removed by in order to form trenches 47 and 48. Additionally, any stress that the wafer experiences during the thermal oxidation step can be reduced due to the oxidizing substance layer which acts as a buffer layer.

EMBODIMENT 2

Figure 19:
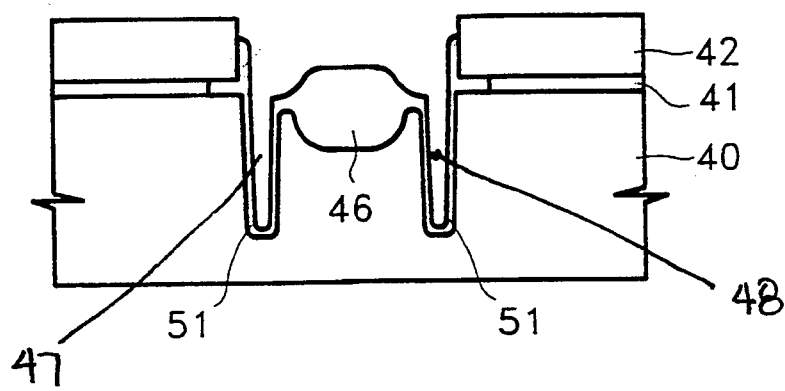
FIGS. 19, 20, and 21 illustrate a second embodiment of the element isolation method according to the present invention.
Figure 20:
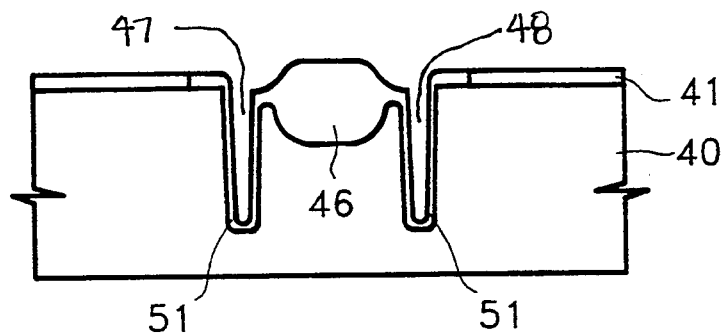
Figure 21:
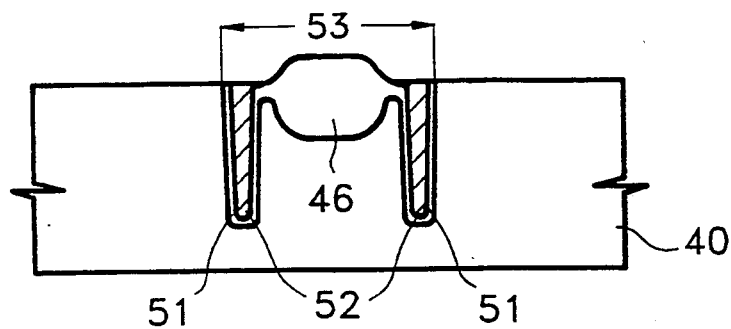

FIGS. 19, 20, and 21 are illustrations according to Embodiment 2 of the present invention. The steps of FIGS. 13-16 of Embodiment 1 also apply to Embodiment 2. Hereinafter, the same reference numerals represent the same parts.

FIG. 19 shows a second thermal oxidation step which is performed after the steps described with respect to FIG. 16 (Embodiment 1) are completed and after the removal of oxide film 44' formed on silicon nitride film 42.

After a first oxide film 46 and trenches 47 and 48 are formed, an oxide film 44' formed on silicon nitride film 42 when first oxide film 46 is formed is removed. Then, a second oxide film 51 with a thickness of about 100Å to 500Å is formed by a second oxidation process step. At this time, oxide film 44', which is formed on the upper part of the silicon nitride film 42, is removed in order to permit subsequent easy removal of the nitride film 42.

FIG. 20 shows a step of removing silicon nitride film 42 from the active region using a phosphatic solution, for example. At this time, a portion of oxide film 51, which is formed by a polysilicon layer oxidized on the sidewalls of silicon nitride film 42, is removed when the capping oxide film is removed just before the silicon nitride film 42 is removed. Therefore, the surface becomes substantially planarized as shown.

FIG. 21 is a sectional view wherein the final element isolation region is completed. An insulating material such as polysilicon or HTO film is deposited on the overall surface of the resultant structure of FIG. 20 to a thickness of hundreds between about a few hundred angstroms to 3,000Å. Then, the insulating material is anisotropically dry-etched to leave the insulating material 52 only in the trenches 47 and 48. Then, the pad oxide film 41 is removed in order to obtain the final element isolation region having an element isolation width 53 is provided, as shown.

According to Embodiment 2 of the present invention, stress to the wafer is reduced by reducing the amount of the oxide created during the second oxidation step. In addition to this, oxide film penetrates less from a trench into an active region to thereby reduce the final element isolation width.

EMBODIMENT 3

Figure 22:
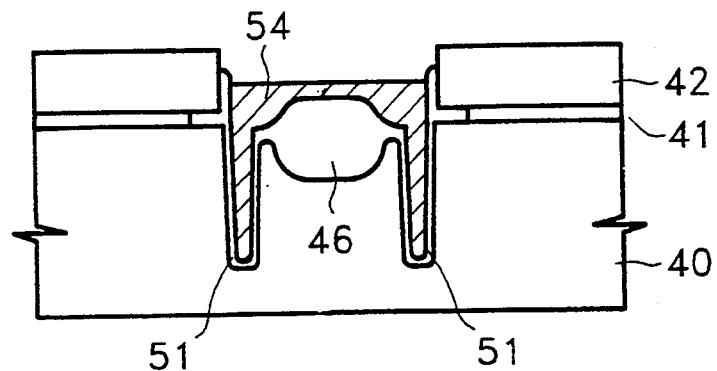
FIGS. 22, 23, and 24 illustrate a third embodiment of the element isolation method according to the present invention.
Figure 23:
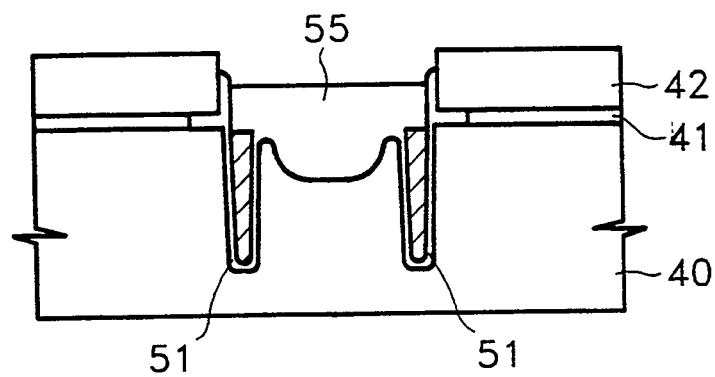
Figure 24:
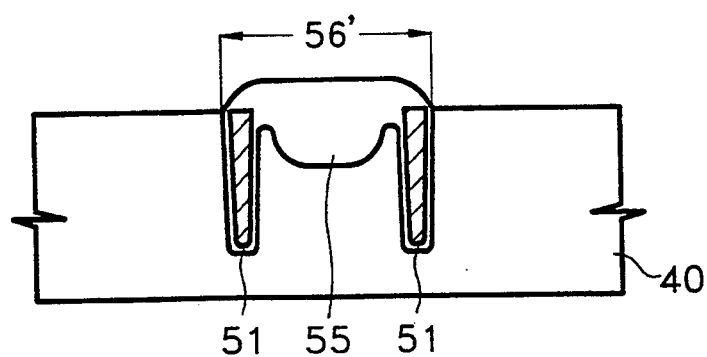

FIGS. 22, 23, and 24 are illustrations according to Embodiment 3 of the present invention. The steps of FIG. 19 of Embodiment 2 also apply to Embodiment 3. Embodiment 3 is a method which enables formation of a stable element isolation region by reducing the slowing of signal processing speed due the thinning of the element isolation film and by reducing parasitic leakage current, by having a thick element isolation film formed on a non-active region.

FIG. 22 illustrates a step of filling the trenches defining an element isolation region with polysilicon. After the steps of FIG. 19, an oxidizing substance such as polysilicon is deposited on the resultant structure of FIG. 19 to a thickness of about 1,000Å to 3,000Å so as to form a polysilicon layer which fills the trenches. Then, the polysilicon layer is anisotropically etched to form a polysilicon pattern 54 which covers first oxide film 46 and fills the trenches which define the element isolation region.

FIG. 23 illustrates a step of oxidizing the polysilicon pattern 54. When the semiconductor wafer is exposed to a high temperature oxidizing (HTO) atmosphere, an upper part of the polysilicon pattern 54 is oxidized by reacting to the oxygen, while the polysilicon that fills the trench remains unoxidized. The thus-formed oxide forms a third oxide film 55 whose thickness is about 500Å to 2,000Å, together which includes the already formed first oxide film 46 seen in FIG. 22.

FIG. 24 is a sectional view of a final element isolation region according to Embodiment 3. First, a capping oxide film (not shown) formed on silicon nitride film 42 is removed, then silicon nitride film 42 formed over the active region is also removed. The wafer is then sacrificed-oxidized to remove any impurities derived from silicon nitride film 42 formed on the active region. Then, pad oxide film 41 is removed to obtain the final element isolation region with an element isolation width 56' as shown.

Therefore, according to Embodiment 3, the element isolation film of a non-active region can be more thickly formed.

EMBODIMENT 4

FIGS. 25 through 32 are illustrations showing an Embodiment 4 of the present invention, wherein the element isolation method can reduce the size of the element isolation region and suppress the generation of a bird's beak when filling the trench.

Figure 25:
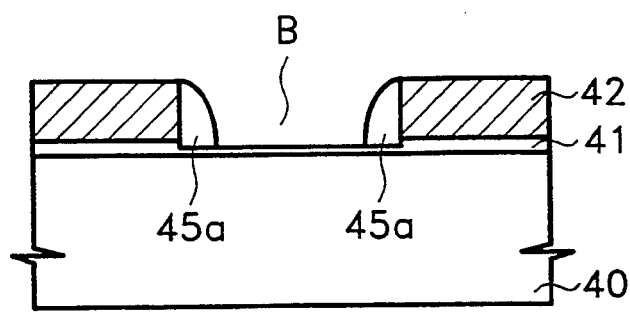
FIGS. 25-32 illustrate a fourth embodiment of the element isolation method according to the present invention.

FIG. 25 shows a step of forming an aperture B and first spacers 45a. In more detail, pad oxide film 41, whose thickness is between about tens of angstroms to 300Å, and a silicon nitride film 42 whose thickness is between about 300Å to 1,500Å are formed on semiconductor wafer 40. Then, a photoresist layer (not shown) is formed by depositing a photoresist. Then, a photoresist pattern is formed on silicon nitride film 42 by way of a mask exposure and development using an i-line stepper. A first aperture B is then formed to define an element isolation region by anisotropically etching silicon nitride film 42 using the photoresist pattern as an etching mask. The width of the first aperture B is between about 0.3μm to 0.5μm. At this time, a part of the pad oxide film 41 exposed through first aperture B may be removed, to thereby obtain a thin pad oxide film portion formed in first aperture B. After that, silicon nitride or HTO is deposited on the resultant semiconductor wafer structure in order to form an insulating film whose thickness is between about 500Å to 1,500Å to subsequently form a spacer. The insulating film is anisotropically etched to form first spacers 45a. First spacers 45a are formed so as to effectively reduce the width of first aperture B. First spacers 45a can therefore reduce the width of the element isolation region to below resolution limit.

Figure 26:
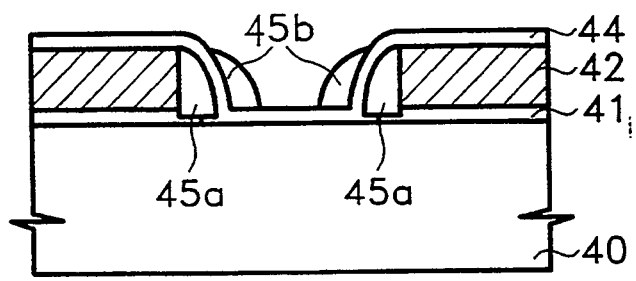

FIG. 26 shows a step of forming an oxidizing material layer 44 and second spacers 45b.

After the steps of FIG. 25, portions of pad oxide film 41 exposed around first spacer 45a are removed by a wet-etching method using an etching solution such as BOE. At this time, portions of pad oxide film 41 below the inner edges of first spacers 45a are removed and an undercut region is formed as shown.

An oxidizing material such as polysilicon is then deposited over the resultant structure to a thickness of about 30Å to 300Å to form a polysilicon layer 44 which fills the undercut regions below first spaces 45a. Then a material for a second spacers such as a silicon nitride film, is deposited on the polysilicon layer 44 to a thickness of about 500Å to 1,500Å. The silicon nitride film is then anisotropically etched to form second spacers 45b formed on polysilicon layer 44. Second spacers 45b define a region for forming a trench in the next step of the process.

Figure 27:
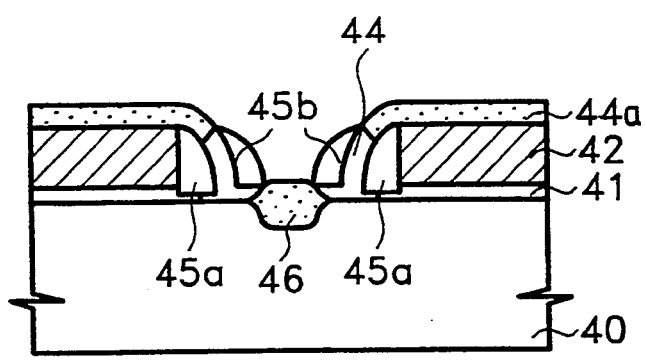

FIG. 27 illustrates a first thermal oxidation step. When the entire semiconductor wafer is exposed to a high-temperature wet oxidation atmosphere using second spacers 45b as an anti-oxide mask, a portion of a polysilicon layer 44 between the second spacers 45b and a portion of semiconductor wafer 40 therebelow are oxidized to form a first thermal oxide film 46 whose thickness is between about 500Å to 1,000Å. At this time, the remaining portions of polysilicon layer 44 on silicon nitride film 42 which are not masked by spacers 45b are oxidized to thereby form a second thermal oxide film 44a.

Figure 28:
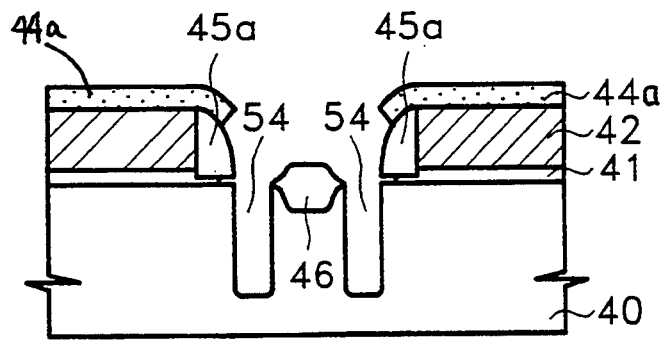

FIG. 28 illustrates a step of forming trenches 54, 54. After the steps of FIG. 27, the polysilicon layer 44 which remains due to the removal of second spacer 45b is exposed using phosphoric acid. At this time, second thermal oxide film 44a protects the silicon nitride film 42 from being removed during the removal of second spacer 45b. Then, second thermal oxide film 44a is removed. The remaining exposed portions of polysilicon layer 44 and semiconductor wafer 40 are anisotropically etched using a first spacer 45a and a first thermal oxide film 46 as etching masks, which then forms trenches 54, 54 on semiconductor wafer 40 with a depth of about 2,000Å to 8,000Å.

Figure 29:
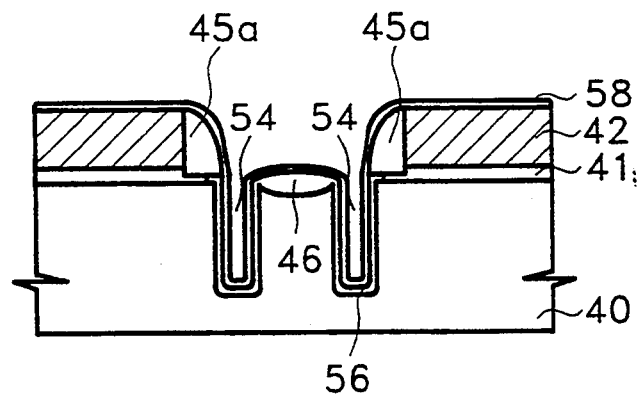

FIG. 29 shows a step of forming a thermal oxide film 56 inside the trenches 54, 54 and forming a second silicon nitride film 58. After the step of FIG. 28, a third thermal oxide film 56 whose thickness is between about 100Å to 500Å is formed inside trenches 54, 54. Then, a second silicon nitride film 58 whose thickness is between about 30Å to 200Å is also formed on the entire surface of the resultant structure. Thus, horizontal oxidation is substantially suppressed (in the direction of a bird's beak) and vertical oxidation is suppressed toward the lower part of the trench. Only the oxidation to the upper part can be maximized by thinly forming a second silicon nitride film 58.

Figure 30:
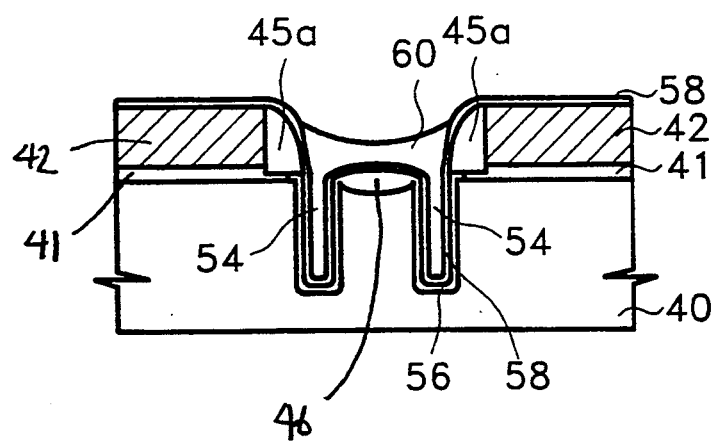

FIG. 30 illustrates a step of filling trenches 54, 54 of the element isolation region with a polysilicon. After the steps of FIG. 29, an oxidizing material such as polysilicon is deposited over the entire resultant structure to a thickness of about 1,000Å to 3,000Å to form a polysilicon layer which fills trenches 54, 54. This polysilicon layer is then anisotropically etched to remove portions of the polysilicon layer from the active regions. Therefore, trenches 54, 54 of the element isolation region are filled, and a polysilicon pattern 60 which covers a first oxide film 46 is formed. A self-aligned planarized silicon pattern 60 can be formed by removing the polysilicon layer portions on the active region using a chemical mechanical polishing (CMP) process instead of anisotropic etching.

Figure 31:
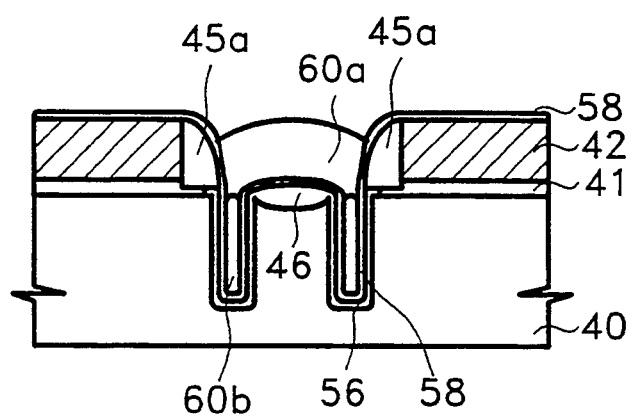

FIG. 31 illustrates steps of thermal oxidation of the polysilicon pattern 60. When the semiconductor wafer 40 is exposed to a high temperature oxidation (HTO) atmosphere, a fourth thermal oxide film 60a, (i.e., an element isolation film), is formed by oxidation of the upper part of the polysilicon pattern 60. Polysilicon portions 60b which fill trenches 54, 54 remain unoxidized. A fourth thermal oxide film 60a with a thickness of about 500Å to 2,000Å is thus formed. Second silicon nitride film 58 formed in the steps of FIG. 29 restrains the fourth thermal oxide film 60a from excessive growth during the process of thermally oxidizing polysilicon pattern 60.

Figure 32:
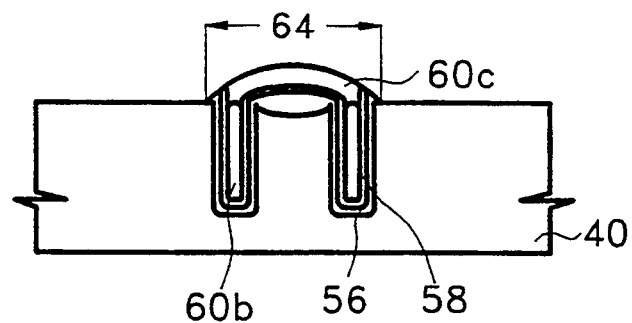

FIG. 32 illustrates a sectional view of the final state of the element isolation region. First, a capping oxide film (not shown) formed during the thermal oxidation in the upper part of silicon nitride film 42 is removed. Then first spacers 45a and a silicon nitride films 58 and 42 which are formed over active regions are removed. Any impurities left in the silicon nitride film which is formed over the active region are removed by a sacrificed oxidization of the wafer 40. Then, the active region is exposed by removal of pad oxide film 41. The final element isolation region is formed to have an element isolation width 64 as shown, and a thermal oxide film 60c that is made thin by a partially removing an upper part of fourth thermal oxide film 60a formed in thermal process.

According to Embodiment 4 of the present invention, first spacers are formed in order to reduce the width of an element isolation region after the active region is formed. Accordingly, the element isolation region is formed below the resolution limits of photo-lithography. That is, if the element isolation region is defined using the present i-line stepper, the minimum width of element isolation region is about 0.3μm, (i.e., the resolution limit), according to the invention disclosed in Embodiments 1, 2 and 3. However, if first spacers are formed as explained in Embodiment 4 and the width of the first spacers is about 500Å, a 0.2μm element isolation region can be formed since the width of the isolation region can be reduced by approximately 0.1μm (i.e., two times 5500Å).

In addition, after the trenches 54, 54 are formed, a silicon nitride film is deposited thinly inside the trenches before they are filled with a polysilicon (an oxidizing material). This deposition of silicon nitride restrains the field oxide film from growing too much during the second thermal oxidation of the polysilicon. As a result, a smaller element isolation structure can be formed.

Figure 33:
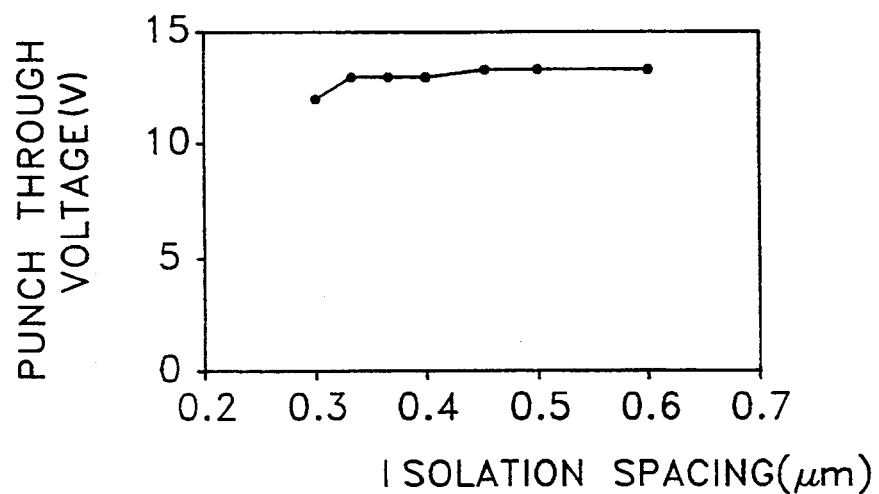
FIG. 33 is a graphical representation of electrical characteristics of an element isolation film of the element isolation method of the present invention.
Figure 34:
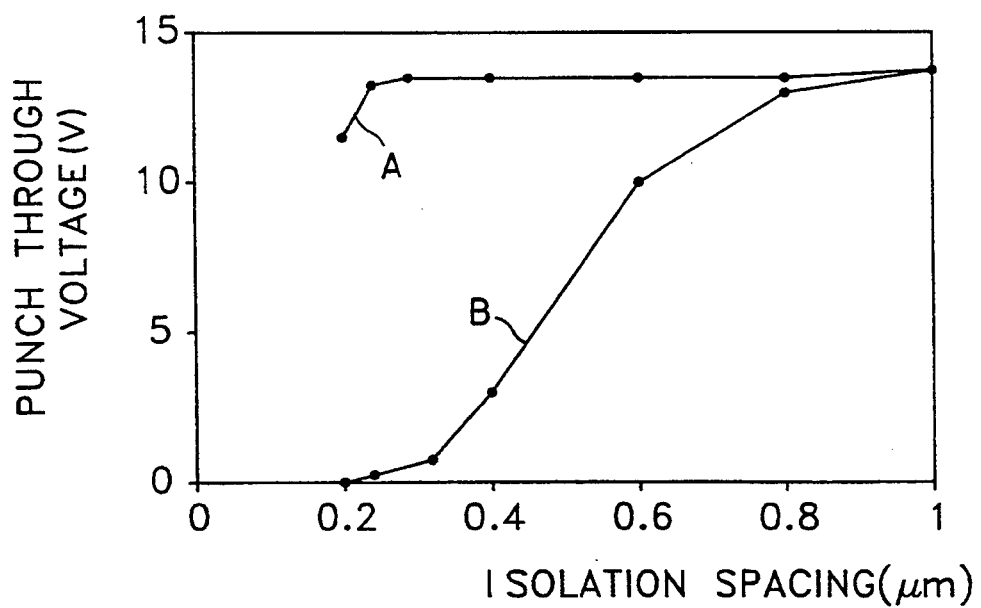
FIG. 34 is a graphical representation comparing the punch-through voltage of a general LOCOS method with an estimated punch-through voltage of an element isolation film of the element isolation method of the present invention, as applied to a NMOS FET.

Experimental results showing the electrical characteristics of an element isolation film obtained according to the embodiments of the present invention are shown in FIGS. 33 and 34.

FIG. 33 is a graphical representation showing electrical characteristics of an element isolation film obtained according to the element isolation method of the present invention. According to the method of the present invention, element isolation films having widths of 0.3μm, 0.35μm, 0.4μm, 0.45μm, 0.5μm, and 0.6μm were formed, and the punch-through voltage between $n^{30}$ active regions was estimated. As shown in FIG. 33, punch-through is effectively suppressed even though a 0.3μm-wide (the size of a limit pattern obtained by an i-line stepper) element isolation film is formed.

FIG. 34 is a graphical representation comparing the punch-through voltage of a general LOCOS method with an estimated punch-through voltage of an element isolation film according to the element isolation method of the present invention as applied to an NMOS FET. Here, element isolation films having widths of 0.2μm, 0.25m, 0.32m, 0.4m, 0.6m, 0.8μm, and 1.0m were formed by the method of the present invention and by a general LOCOS method. The punch-through voltage between the $n^{30}$ active regions was then estimated. The plotted line "A" of FIG. 34 represents punch-through voltage obtained using the element isolation film formed by the method of the present invention, while plotted line "B" shows punch-through voltage obtained through the use of an element isolation film formed by the general LOCOS method. As shown in FIG. 34, a punch-through phenomenon occurs when the width of the isolation region is below 0.8μm according to the general LOCOS method, while the present invention shows a good element isolation characteristic even though the width of the element isolation region is decreased to as little as 0.2μm. Therefore, dense integration of semiconductor devices can be accomplished by forming an element isolation region having a size below resolution limitations, while maintaining good element isolation characteristics.

It should be understood that although preferred embodiments of the invention have been described in detail above, many modifications and variations could be effected therein by one with ordinary skill in the art without departing from the spirit and scope of the invention as defined by the appended claims.

What is claimed is:

1. A method for manufacturing an element isolation region of a semiconductor device, comprising the steps of:
    (a) forming an insulating layer having at least one aperture on a semiconductor wafer;
    (b) forming an oxidizable material layer over said insulating layer including said at least one aperture;
    (c) forming a first spacer on the oxidizable material at the peripheral surface of said at least one aperture;
    (d) forming a thermal oxide film by thermally oxidizing said oxidizable material layer excluding a portion thereof masked by said first spacer;
    (e) removing said first spacer and the resulting underlying material thereby leaving a portion of said semiconductor wafer exposed; and
    (f) forming a trench in said semiconductor wafer by etching said exposed portion of said semiconductor wafer to thereby define an element isolation region.

2. A method for manufacturing an element isolation region according to claim 1, wherein said step of forming an insulating layer comprises stacking a nitride film on a pad oxide film.

3. A method for manufacturing an element isolation region according to claim 2, further comprising a step of etching a peripheral portion of said pad oxide film adjacent to said aperture to obtain an undercut region, before said step of forming an oxidizable material layer.

4. A method for manufacturing an element isolation region according to claim 1, wherein said step of forming an oxidizable material layer consists of forming a polysilicon layer.

5. A method for manufacturing an element isolation region according to claim 1, wherein said first spacer is a nitride.

6. A method for manufacturing an element isolation region according to claim 1, further comprising the steps of:
    (a) filling said trench with an insulating material; and
    (b) removing said insulating material from said semiconductor wafer.

7. A method for forming an element isolation region on a semiconductor wafer, comprising the steps of:
    (a) forming an insulating film having an aperture on said wafer which exposes a portion thereof, said insulating film having a lower pad oxide film portion and an upper nitride film portion;
    (b) forming an undercut region under said nitride film portion by etching said pad oxide film adjacent said aperture;
    (c) forming an oxidizable material layer on said insulating film and said exposed portion of said semiconductor wafer in said aperture;
    (d) forming a first spacer on the oxidizable material at the a sidewall of said aperture;
    (e) thermally oxidizing said oxidizable material layer, using said first spacer as an anti-oxidizing mask;
    (f) removing said first spacer to thereby expose an unoxidized portion of said oxidizable material layer;
    (g) forming a trench by etching said exposed portion of said oxidizable material layer and a portion of said semiconductor wafer therebelow using said thermal oxide film as an etching mask;
    (h) filling said trench with an insulating material; and
    (i) removing said insulating material formed on said semiconductor wafer to obtain an element isolation region.

8. A method for forming an element isolation region according to claim 7, wherein further including a step of forming a thermal oxide on an interior surface of said trench.

9. A method for forming an element isolation region according to claim 7, further comprising the steps of:
   (a) removing said thermal oxide film functioning as an etching mask, before filling said trench; and
   (b) forming an oxide film on an inner surface of said trench.

10. A method for forming an element isolation region according to claim 9, further comprising the steps of:
    (a) removing said nitride film; and
    (b) forming an insulating layer over the resultant structure, thereby filling said trench.

11. A method for forming an element isolation region according to claim 10, wherein said step of forming an insulating layer includes forming a polysilicon layer.

12. A method for forming an element isolation region according to claim 9, further comprising the steps of:
    (a) forming an oxidizable insulating material layer over the resultant structure after forming said oxide film;
    (b) etching back said oxidizable insulating material layer so that portions thereof remain in said trench to obtain an insulating material pattern on said element isolation region; and
    (c) partially oxidizing said insulating material pattern.

13. A manufacturing method of an element isolation region on a semiconductor wafer, comprising the steps of:
    (a) forming an insulating layer having at least one aperture on a semiconductor wafer, said aperture leaving a portion of said semiconductor wafer exposed;
    (b) forming a first spacer on a sidewall of said at least one aperture;
    (c) forming an oxidizable material film over said insulating layer, said first spacer, and said exposed portion of said semiconductor wafer;
    (d) forming a second spacer in said aperture on said oxidizable material, said second spacer being disposed inwardly relative to said first spacer;
    (e) forming a first thermal oxide film portion in a region of said aperture surrounded by said second spacer and forming a second thermal oxide film portion over said insulating layer by thermal oxidation, using said second spacer as an anti-oxidant mask to thereby leave an oxidizable material film portion thereunder;
    (f) removing said second spacer to expose said oxidizable material film portion; and
    (g) etching said oxidizable material film portion and a portion of said semiconductor wafer immediately thereunder to obtain a trench defining said element isolation region.

14. A manufacturing method of an element isolation region on a semiconductor wafer according to claim 13, further comprising the steps of:
    (a) forming a silicon nitride film in said trench;
    (b) filling said trench having said silicon nitride film therein with an oxidizable material; and
    (c) partially oxidizable said oxidizing material in said trench.

15. A manufacturing method of an element isolation region on a semiconductor wafer according to claim 14, wherein said oxidizable material is a polysilicon.

16. A manufacturing method of an element isolation region on a semiconductor wafer according to claim 13, wherein said first spacer is made from a material selected from the group consisting of silicon oxide and silicon nitride.

17. A manufacturing method of an element isolation region on a semiconductor wafer according to claim 13, wherein said insulating film and said second spacer are made of silicon nitride.

18. A method of manufacturing an element isolation region on a semiconductor wafer, comprising the steps of:
    (a) forming a compound material layer having an aperture which exposes a portion of said semiconductor wafer;
    (b) forming a first spacer on a sidewall of said aperture;
    (c) forming an oxidizable material layer over said compound material layer, said first spacer, and said exposed portion of said semiconductor wafer;
    (d) forming a second spacer on a portion of said oxidizable material layer covering said first spacer;
    (e) thermally oxidizing said oxidizable material layer using said second spacer as an anti-oxidation mask and a portion of said semiconductor wafer in said aperture below said oxidizable material layer to obtain first and second thermal oxide film portions, respectively;
    (f) removing said second spacer;
    (g) removing said first thermal oxide film portion;
    (h) forming a trench by removing a remaining portion of said oxidizable material layer masked by said second spacer and anisotropically etching said semiconductor wafer therebelow;
    (i) forming an insulating film within said trench; and
    (j) depositing an insulating material in said trench having said insulating film.

19. A method of manufacturing an element isolation region on a semiconductor wafer according to claim 18, wherein said compound material layer comprises a pad oxide film portion and a silicon nitride film portion.

* * * * *